United States Patent [19]

Mathews

[11] Patent Number: 5,278,515
[45] Date of Patent: Jan. 11, 1994

[54] HIGH BANDWIDTH INFORMATION CHANNEL WITH OPTOCOUPLING ISOLATION

[75] Inventor: Kurk D. Mathews, Redwood City, Calif.

[73] Assignee: Uniphase Corporation, San Jose, Calif.

[21] Appl. No.: 996,554

[22] Filed: Dec. 24, 1992

[51] Int. Cl.$^5$ .............................................. H03F 17/00
[52] U.S. Cl. ................................. 330/59; 250/214 A; 330/308
[58] Field of Search ................... 250/214; 330/59, 308; 359/153, 189

[56] References Cited

U.S. PATENT DOCUMENTS

4,536,715  8/1985  Basarath et al. ................. 330/308 X

Primary Examiner—James B. Mullins
Attorney, Agent, or Firm—Skjerven, Morrill, MacPherson, Franklin & Friel

[57] ABSTRACT

An accurate direct current to 1 MHz (or more) analog information channel with 7.5 kV input to output isolation is provided using a commercially available optoelectronic isolator. The relatively slow response, (limited bandwidth) of the LED portion of the opto-electronic isolator is overcome by providing a frequency compensated negative feedback loop around the servo photodetector in the opto-electronic isolator. The feedback loop includes proper frequency compensation for the phase lag properties of both the LED and the servo photodetector, thus extending the bandwidth well beyond the 200 KHz typical of such opto-electronic isolators.

12 Claims, 5 Drawing Sheets

KEY TO Fig. 3

| Fig. 3' | Fig. 3" |

Fig. 4

HIGH BANDWIDTH INFORMATION CHANNEL WITH OPTOCOUPLING ISOLATION

BACKGROUND OF THE INVENTION

1 Field of the Invention

This invention relates to a high bandwidth information channel for carrying analog signals with electrical isolation provided by an optocoupler, and specifically to such an information channel with frequency compensation to overcome the low bandwidth characteristic of the optocoupler LED.

2. Description of the Prior Art

Prior art in the field of wideband low noise information channels includes the well-known opto-electronic isolators (optocouplers), wherein a photo-detector receives a light signal from a light emitting diode (LED). Such prior art devices have the significant disadvantage of electronic drift, i.e., performance varies with ambient humidity, temperature and time. In addition, the opto-electronic isolation technology is inherently non-linear and has limited bandwidth, so that such devices typically are able to carry signals having a maximum frequency of about 200 to 300 KHz.

It is also well known to use other techniques such as a conventional electrical transformer isolator with a V/F (voltage to frequency) converter for information channels. Such devices also have limited bandwidth and cannot carry signals with a frequency as high as 1 MHz.

Also well-known are pulse width modulators which accept an input signal and transform it into a constant frequency (i.e. A.C.) signal but with a duty factor proportional to the input signal. This constant frequency signal from the PWM is put to a conventional transformer or opto-electronic isolator, and then through a discriminator, i.e. demodulator to recover the input signal. However this device cannot carry an input signal having a frequency equal to the modulating frequency; the maximum bandwidth is about $\frac{1}{3}$ or $\frac{1}{4}$ of the modulating frequency, which is a significant disadvantage for carrying high frequency signals, since providing a 3 or 4 MHz modulating frequency is difficult.

The use of opto-electronic isolators is considered especially beneficial since such devices are relatively inexpensive. However, as stated above they are generally thought to provide only very limited bandwidth, i.e. have a low upper frequency limit for carrying signals. For instance, the photoconductive isolation amplifier of FIG. 1a accepts an analog input signal $V_{in}$ provided to the positive (non-inverting) terminal of a first operational amplifier A1, the output of which is then provided to the LED via resistor R2. The LED transmits light signals to the matched photodiode pair PD1, PD2. Photodiode PD2 provides a current output signal to output amplifier A2 which provides the output voltage signal $V_{out}$. Photodetector PDI is the feedback photodiode and provides the feedback signal $I_{PD1}$ back to the negative (inverting) terminal of input amplifier Ai. This feedback signal corrects for problems such as degradation of the photodetectors or degradation of the insulating medium, linearizes the LED output signal, and eliminates the time and temperature drift which is otherwise a problem with the LED. Electrical isolation is provided between the input side and output side since the only communication therebetween is light signals.

Figure 1A:
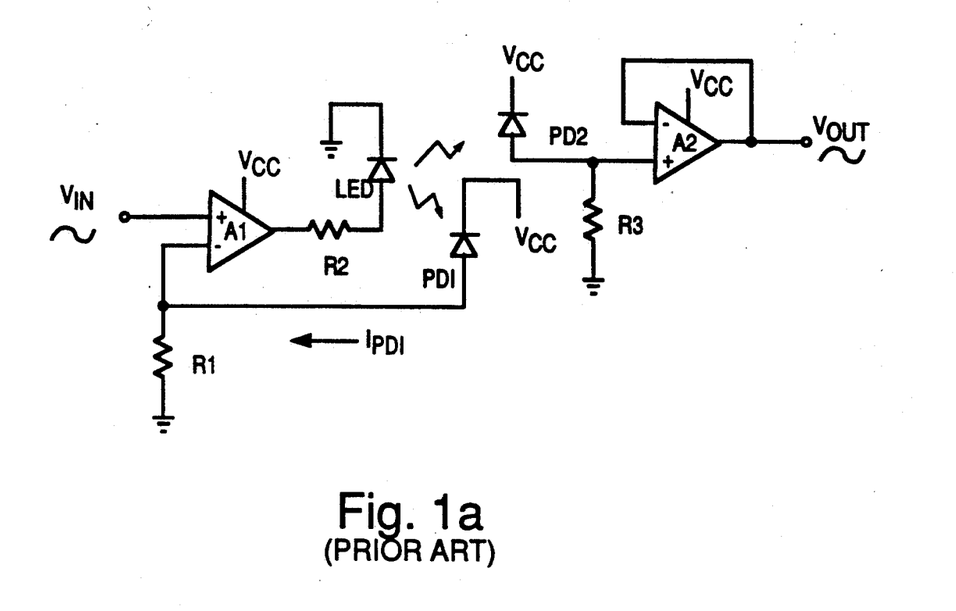
FIGS. 1a and 1b show prior art isolation amplifiers using optocouplers.

Such a circuit wherein the LED and the two photodiodes are included within a single optocoupler device (such as a Siemens IL300 optocoupler) are often considered to have a maximum bandwidth of 100 KHz, even using the frequency compensated 741-type op amp (operational amplifier) for amplifiers A1 and A2. Such prior art frequency compensated op amps "roll off" the frequency response curve well below the frequency at which the LED-induced phase lag might cause undesirable feedback oscillations. The bandwidth is therefore limited due to the inherently relatively slow response time (phase lag) of the LED.

Figure 1B:
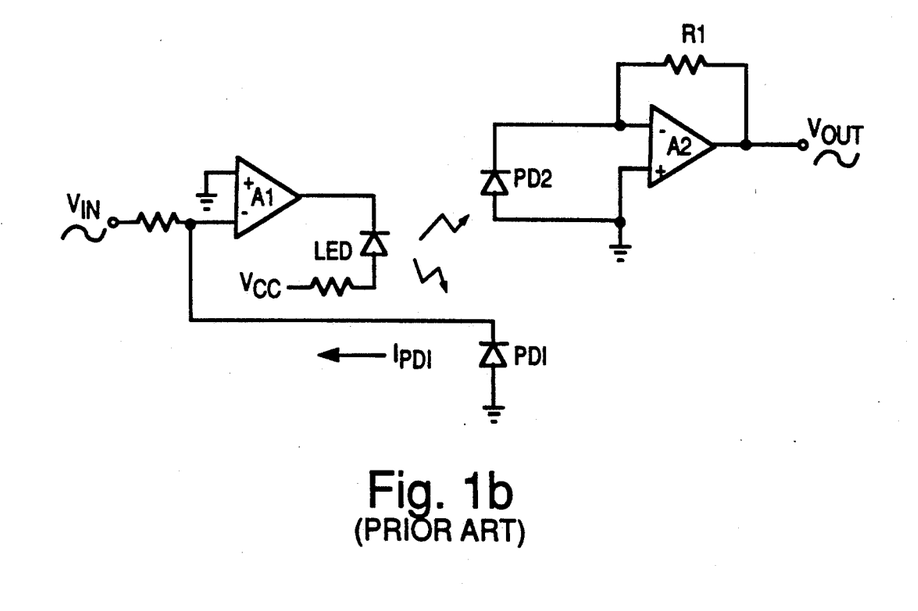

Another similar prior art circuit shown in FIG. 1b is a photovoltaic isolation amplifier including similar components as in FIG. 1a but connected somewhat differently to provide a voltage output signal as the input signal to output amplifier A2. It is generally thought that the photoconductive photodiode operation of FIG. 1a provides the largest coupled frequency bandwidth for such optocouplers, but this is still limited to about 200 KHz maximum. Such a low bandwidth is undesirable in many applications, such as those requiring for instance an accurate direct current to 1 MHz analog information bandwidth with high input-to-output isolation. Such isolation (typically 7.5 Kilovolts) is often required for safety reasons for use in particular types of instrumentation. For instance, one application is a user interface to a switching power supply where isolation is needed between the user interface and the power supply voltage itself.

One prior art solution not using an optocoupler is described in U.S. Pat. No. 5,097,229 issued Mar. 17, 1992 to Charles 0. Forge. This discloses an analog direct current to 1 MHz information channel with high accuracy and having input/output isolation. However this patent uses a special transformer combined with a number of other components to provide the electrical isolation, and hence is relatively expensive. It would be desirable to have a circuit providing similar performances as that described in the above-referenced patent but using an opto-electronic isolator instead of a transformer.

SUMMARY OF THE INVENTION

A high bandwidth analog information channel uses an opto-electronic isolator (optocoupler) in which the slow response of the optocoupler LED is overcome by closing a frequency compensated negative feedback loop around the servo photodetector of the optocoupler. The feedback loop compares the analog input signal to the optocoupler servo photodetector signal, and servos the LED output so that the photodetector output signal tracks the analog input.

The prior art feedback loops, as shown in FIGS. 1a and 1b, do not provide the needed frequency compensation to extend the bandwidth significantly. In accordance with the present invention the input amplifier (which drives the LED) is frequency compensated for the LED phase lag, and also a separate frequency compensation stage is provided which in one embodiment is connected between the output terminal of the input amplifier and the LED, for further closed loop frequency compensation.

Specifically, the input amplifier is frequency compensated for the characteristic roll off frequency of the LED itself, and the additional frequency compensation provided to the input signal to the LED compensates for phase lag caused by the capacitance of the servo photodiode and by the input capacitance to the input amplifier.

Additionally, in one embodiment frequency compensation is provided on the output photodiode side, to further improve transmission characteristics of the system.

DETAILED DESCRIPTION OF THE INVENTION

Figure 2:
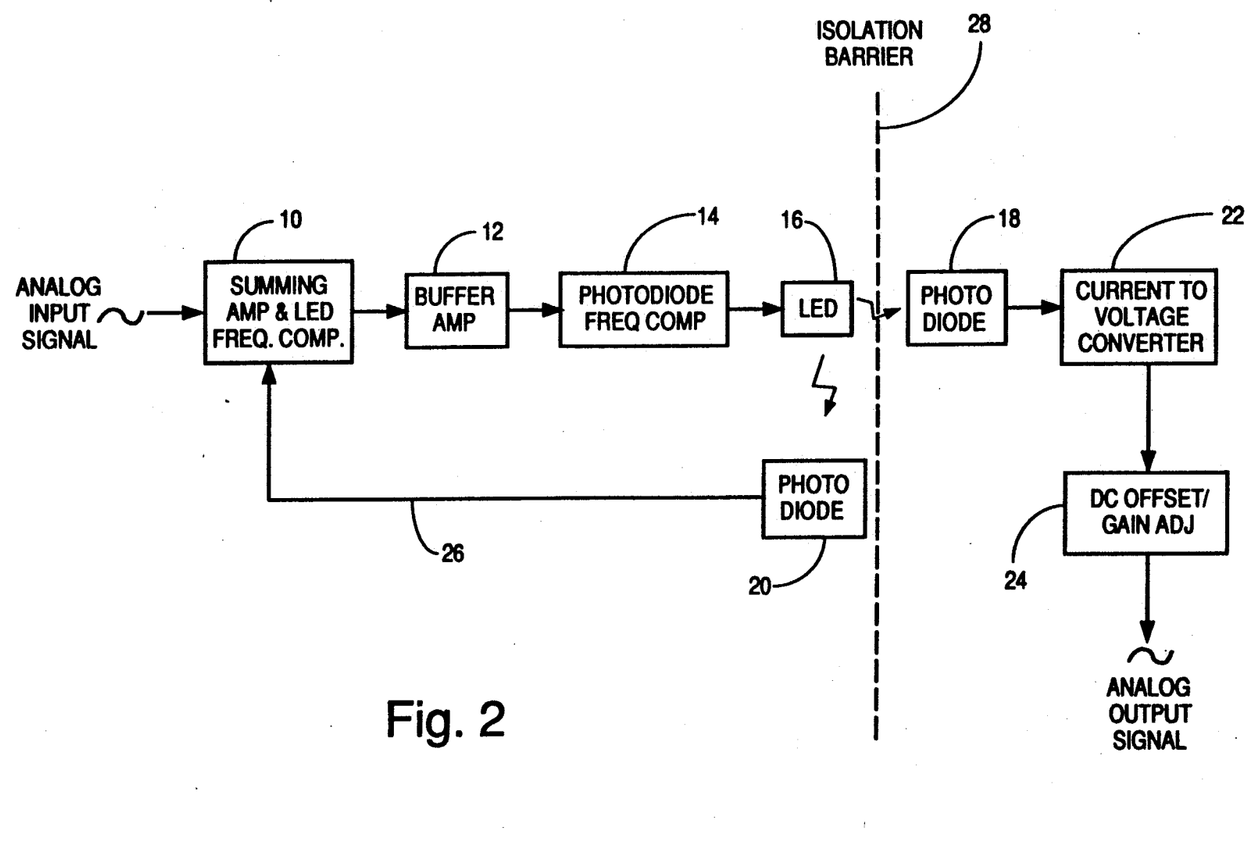
FIG. 2 is a block diagram showing an information channel in accordance with the present invention.

FIG. 2 shows an information channel in block diagram form in accordance with the present invention. The analog input signal (which for instance is a control signal for commanding a switching power supply or other typical application where electrical isolation is required) is provided to a summing amplifier 10 which is frequency compensated to correct for phase lag in LED (light emitting diode) 16. The output signal of summing amplifier 10 is provided to a conventional buffer amplifier 12 which in turn drives a photodiode frequency compensation circuit 14 which (as described above) compensates for phase lag caused by (1) servo photodiode 20, and (2) the input capacitance to summing amplifier 10.

LED 16 provides a light output signal and response which is directed to matched photodiode (photodetector) set 18, 20. Matched with respect to the photodiodes and LED means that the two photodiodes each receive a fixed portion of the light emitted by the LED. What is important is that the ratio of the portions does not change with time, or as the flux produced by the LED vs. current changes. It is to be understood that in most applications LED 16, photodiode 18, and photodiode 20 are included in one commercially available optocoupler such as the Siemens IL 300. Alternatively these elements are discrete components.

The output signal from output photodiode 18 is provided to current to voltage converter 22 which in turn drives direct current offset and gain adjust circuit 24, which provides the analog output signal. Such a circuit provides the isolation barrier 28 as shown between the LED 16 and the output photodiode 18, having at least 7.5 Kilovolts isolation and capable of carrying a D.C. to 1 MHz or greater frequency signal. Feedback loop 26 provides the output signal from servo diode 20 as an input to summing amplifier 10, providing feedback to compensate for drift and other deficiencies inherent in LED 16.

Differences between the circuit of FIG. 2 and those of FIGS. 1a and 1b include (1) the type of frequency compensation of summing amplifier 10, and (2) the provision of additional frequency compensation circuit 14. Additionally, in the circuit of FIG. 2 frequency compensation is provided on the receiver side in current-to-voltage converter 22. However, inherently the need for frequency compensation is mostly on the transmitter (LED 16) side. Thus the frequency compensation on the receiver side (in current to voltage converter 22) is dispensed with in certain embodiments.

Thus the circuit of FIG. 2 includes two compensation network zeroes to compensate for (1) the major pole caused by the LED 16 at 200 KHz in this case; and (2) a secondary pole caused by the input resistor to summing amplifier 10, the capacitance associated with servo photodiode 20, and the input capacitance of summing amplifier 10. Thus, the closed loop 90° phase shift having 20 dB per decade slope extends the bandwidth of the transmitter side (i.e. to the left of isolation barrier 28) considerably upwards, to at least one MHz.

As a matter of technical background, it is well known that an operational amplifier has an internal phase shift from input to output which is greatest at high frequencies, and that at some frequencies a total loop phase shift from the inverting input terminal to the output terminal and back to the input terminal via a feedback network can add up to a total of $-360°$. At this point the circuit is so unstable that it oscillates at high frequency. Well known measures to combat such instability in feedback systems include the use of capacitors and resistor compensation networks to reduce the loop voltage gain below unity before the phase shift comes close to $-360°$. Alternatively, a phase network may be employed to reduce the total phase lag. Some operational amplifiers have internal compensation which limits, however, their frequency response.

It is thus well known to use frequency compensation to prevent oscillations in feedback networks using operational amplifiers. Note that the loop gain as defined above is the gain all around the feedback loop, as contrasted to the amplifier open loop gain from the amplifier inverting input terminal to the amplifier output terminal. The loop phase shift is the total phase shift around the loop. Further, a fall off in voltage gain of characteristics of the amplifier) is often expressed in terms of 20 dB for each tenfold increase in frequency ($-20$ dB/decade). The pole frequency is then defined as the frequency at which the gain is down by 3 dB from its midband value. The phase shift typically increases from 0 until it is $-45°$ at the pole frequency, and then continues to increase the frequency to a maximum of $-90°$. Hence the significance of the poles and the $-20$ db per decade fall off.

Lag compensation and lead compensation are the two methods typically used to stabilize operational amplifier feedback circuits. In each case, a resistance-capacitance network is connected into the circuit so if it is part of the feedback loop. Usually as recommended by the operational amplifier device manufacturer, the network is connected to specified points within the op amp using external terminals provided on commercially available op amps. The components of the lag network are selected so as to introduce a dominant pole in order to move the frequency at which the loop gain is one to a lower frequency, making the circuit more stable. Conversely other networks introduce a phase lead, canceling some of the unwanted phase lag in portions of the circuit, consequently rendering the circuit more stable.

Figure 3:
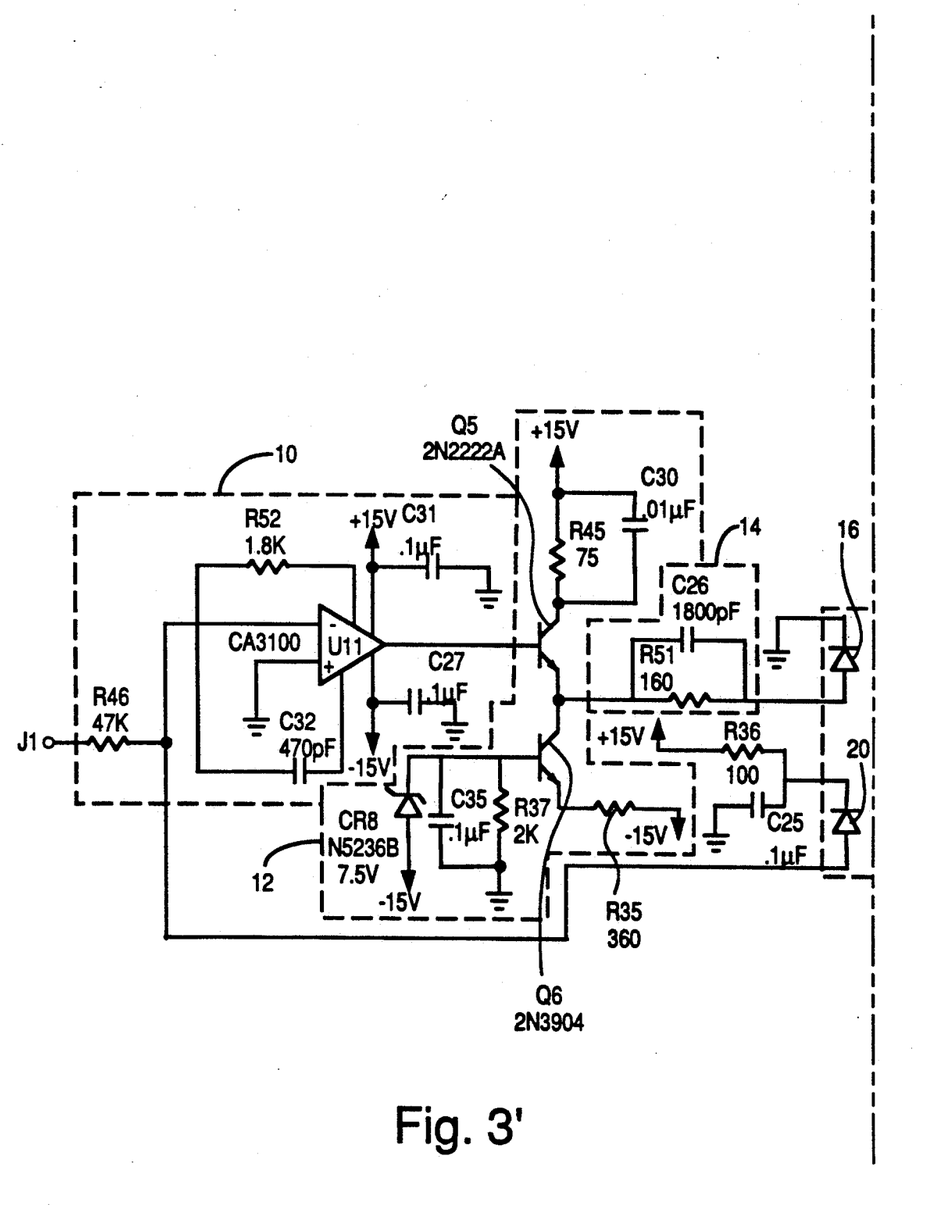
FIG. 3' and 3" are schematic showing detail of the apparatus of FIG. 2.

FIG. 3 (including FIGS. 3', 3") is a schematic showing detail of one version of the circuit of FIG. 2. The various blocks of FIG. 2 are shown in dotted outline surrounding particular associated components in FIG. 3. FIG. 3 also shows specific parts values (including resistance in ohms) and identifications for clarity. It is to be appreciated that other components and values are compatible with the present invention. For instance, other types of optocouplers may be used, including other types of light emitters and photodetectors.

As shown in FIG. 3, component U8 is the Siemens IL 300 (or IL 300G) Linear Optocoupler which includes an AlGaAs LED 16 irradiating both a feedback PIN photodiode 20 and an output PIN photodiode 18 in a bifurcated arrangement. The feedback photodiode captures a percentage of the LED's 16 flux and generates a control signal that can be used to servo the LED 16 drive current. This compensates for the LED's 16 nonlinear, time, and temperature characteristics. The output photodiode 18 produces an output signal linearly related to the servo optical flux created by the LED 16. The IL300 device is described by its manufacturer as having a maximum useful bandwidth of not much greater than 200 KHz.

The analog input signal to the circuit is applied to terminal J1. The inverting (−) terminal of amplifier U11 in summing amplifier block 10 is the summing node for the input current signal (input voltage from terminal JI via resistor R46) and current from the feedback photodiode 20 of optocoupler U8. Resistor R36 and capacitor C25 bias the feedback photodiode 20 and filter the supply voltage thereto. The junction capacitance Cj (not shown) of feedback photodiode 20 at 15V reverse bias is about 3pF. This adds to approximately 4pF of stray and input capacitance at the summing amplifier non-inverting terminal.

Resistor R46 and this input capacitance create a pole in the circuit loop gain at approximately 500 KHz. Capacitor C32 sets the unity gain crossover frequency of amplifier U11 (which is an externally compensated op amp as shown) to about 1.5 Mhz. Resistor R52 forms a zero at approximately 200 Khz in amplifier U11's transfer function. This 200 Khz zero cancels the loop pole caused by the time constant (phase lag) of LED 16. Components R52 and C32 form a lead (zero) network.

Transistor Q6, zener diode CR8, capacitor C35, resistor R35 and resistor R37 form a 20 mA current sink for the class A buffer amplifier stage 12 following amplifier U11. The buffer stage 12 isolates the output impedance of summing amplifier U11 and provides enough drive capacity for variations in LED 16 to feedback photodiode transfer gain.

Resistor R75 limits fault current and capacitor C30 shorts resistor R45 for frequencies of interest. In frequency compensation stage 14, Capacitor C26 and resistor R51 form a 500 Khz zero compensation network to cancel the resistor R46/Cj/amplifier Cin pole as described above. Therefore, nominally, the overall loop gain of the circuit has a 90 degree phase margin and −20 db/decade gain slope through crossover.

Receiver photodiode 18 (in optocoupler U8) is located on the other side of the isolation barrier (which is a light pipe and not shown here). In current to voltage converter stage 22, capacitor C23 sets amplifier U7's crossover frequency at approximately 10 MHz. Capacitor C23, C24 and resistor R50 create a zero at approximately 2 MHz and a pole at approximately 5 MHz in amplifier U7's transfer function. Junction capacitance Cj (not shown) of the output photodiode 18, amplifier U7's input capacitance, resistor R49 and capacitor C29 create a pole in the loop gain at approximately 2 MHz and a zero at approximately 5 MHz. The poles and zeros cancel, leaving another −20 db/decade nominal slope through crossover. The analog output voltage signal, without gain/offset adjustment, is available at the output terminal of amplifier U7.

In the DC offset/gain adjustment circuitry 24, resistors R26, R27, R29, R34 adjust gain and offset of the output signal before the next stage, which in this case is an integrator circuit including amplifier U5. The ultimate output signal is in this case the current out of the U5 summing node (the inverting terminal).

Figure 4:
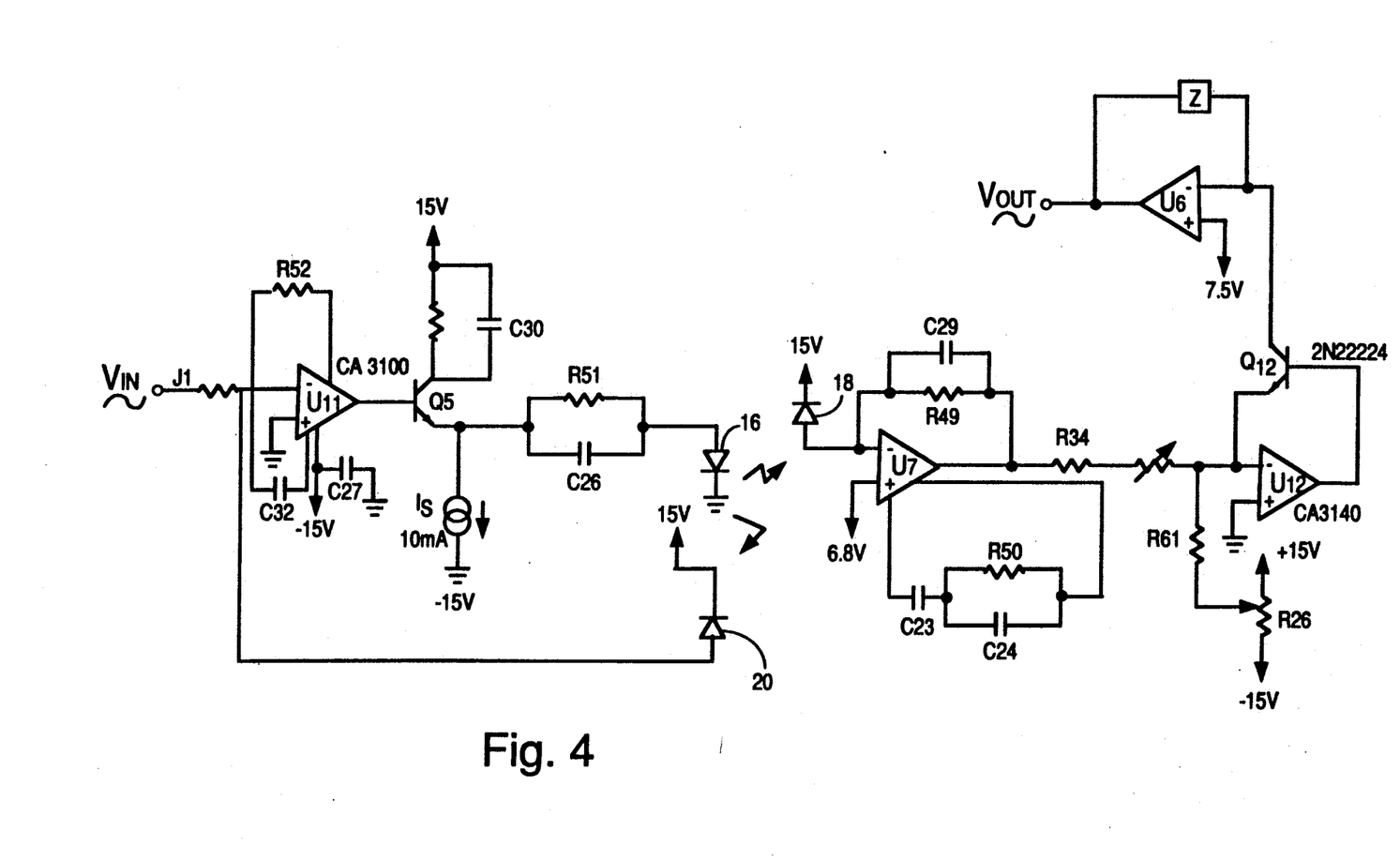
FIG. 4 is a schematic showing another embodiment of an information channel in accordance with the present invention.

A high impedance buffer is used in another embodiment following the gain and offset resistors to enhance integrator or subsequent circuit performance. FIG. 4 shows this other embodiment having a high impedance buffer on the output side. Most of the components shown in FIG. 4 are similar to the identically numbered components of FIG. 3, with the addition of amplifier U12 which is a high impedance (impedance 2) buffer located between the gain and offset circuitry (here resistors R34, R29, and R26) and the output stage amplifier U6. Also shown in FIG. 4 is current sink $I_S$ as an equivalent to the current sink circuitry in FIG. 3. The high impedance buffer thus includes operational amplifier U12 driving transistor Q12, the output of which in turn drives amplifier U6 which converts current to voltage, providing the analog output signal $V_{out}$.

Other embodiments would use higher bandwidth optocouplers but a similar frequency compensation method to carry even higher bandwidth signals. In yet another embodiment, the locations in the circuit of the LED and photodiode compensation are exchanged compared to that in FIG. 2.

The above description is illustrative and not limiting; further modifications will be apparent to one of ordinary skill in the art in light of this disclosure.

I claim:

1. An apparatus for transferring analog signals and providing electrical isolation comprising:
   a frequency compensated first amplifier for receiving at an input terminal thereof an analog signal, and generating a frequency compensated output signal in response;
   a frequency compensated light emitting circuit operatively connected to the first amplifier for receiving the frequency compensated output signal and generating a further frequency compensated light signal in response;
   a first photodetector for receiving the light signal and generating an electrical output signal in response; and
   a second photodetector for receiving the light signal and generating an electrical feedback signal in response, the feedback signal being provided to the input terminal of the first amplifier.

2. The apparatus of claim 1, wherein the frequency compensated light emitting circuit comprises:
   a light emitting diode having an input terminal; and
   a frequency compensation network having an output terminal connected to the input terminal of the light emitting diode and having an input terminal for receiving the frequency compensated output signal from the first amplifier.

3. The apparatus of claim 2, further comprising a buffer amplifier having an input terminal for receiving the frequency compensated signal, amplifying same, and providing the amplified signal to the input terminal of the frequency compensation network.

4. The apparatus of claim 2, wherein the frequency compensation network provides phase compensation bearing a predetermined relationship to the capacitance of the second photodiode combined with an input capacitance of the first amplifier.

5. The apparatus of claim 2, wherein the light emitting diode has a characteristic roll of frequency, and the frequency compensation in the first amplifier compensates for the characteristic rolloff frequency.

6. The device of claim 1, wherein the first and second photodetectors are matched photodetectors.

7. The apparatus of claim 1, further comprising a frequency compensated current to voltage converter for receiving the electrical output signal and providing a frequency compensated voltage modulated signal in response.

8. The apparatus of claim 7 further comprising an offset circuit for setting a voltage level of the voltage modulated signal.

9. The apparatus of claim 8 further comprising a second amplifier for amplifying an output signal from the offset circuit.

10. The apparatus of claim 7 wherein the voltage to current converter includes:
an output amplifier; and
a frequency compensation network for modifying an output signal of the output amplifier.

11. A method for optically transmitting an analog signal comprising:
providing a light emitter and two receiving photodetectors each juxtaposed to the light emitter;
frequency compensating the analog signal for a characteristic roll off frequency of the light emitter;
subjecting the frequency compensated signal to a further step of frequency compensation;
driving the light emitter with the further frequency compensated signal to generate a light output signal;
receiving the light output signal at each of the two photodetectors thereby generating an output signal from each of the photodetectors;
feeding back the output signal of one of the two photodetectors into the analog signal; and
obtaining the output signal from the other of the two photodetectors.

12. The method of claim 11, wherein the step of subjecting includes frequency compensating for phase lag caused by the other of the two photodetectors.

* * * * *

UNITED STATES PATENT AND TRADEMARK OFFICE
CERTIFICATE OF CORRECTION

PATENT NO. : 5,278,515
DATED : January 11, 1994
INVENTOR(S) : Kurk D. Matthews

It is certified that error appears in the above-indentified patent and that said Letters Patent is hereby corrected as shown below:

```
Column 2, line 30
     delete number "0" and insert letter -- O --.

Column 5, line 19
     delete "JI" and insert -- J1 --.
```

Signed and Sealed this

Twenty-fifth Day of October, 1994

Attest:

BRUCE LEHMAN

*Attesting Officer*  *Commissioner of Patents and Trademarks*